United States Patent
Cloos et al.

(10) Patent No.: US 10,151,813 B2
(45) Date of Patent: Dec. 11, 2018

(54) MAGNETIC RESONANCE APPARATUS AND METHOD FOR OPERATION THEREOF WITH ACTIVELY CONTROLLABLE RADIO-FREQUENCY COIL PROFILES

(71) Applicants: NEW YORK UNIVERSITY SCHOOL OF MEDICINE, New York, NY (US); SIEMENS HEALTHCARE GMBH, Erlangen (DE)

(72) Inventors: Martijn Cloos, Long Island City, NY (US); Lars Lauer, Neunkirchen (DE); Daniel Sodickson, Larchmont, NY (US); Graham Wiggins, New York, NY (US)

(73) Assignees: Siemens Healthcare GmbH, Erlangen (DE); New York University, New York, NY (US)

( * ) Notice: Subject to any disclaimer, the term of this patent is extended or adjusted under 35 U.S.C. 154(b) by 346 days.

(21) Appl. No.: 15/196,305

(22) Filed: Jun. 29, 2016

(65) Prior Publication Data
US 2018/0003787 A1    Jan. 4, 2018

(51) Int. Cl.
| | |
|---|---|
| *G01R 33/48* | (2006.01) |
| *G01R 33/483* | (2006.01) |
| *G01R 33/34* | (2006.01) |
| *G01R 33/36* | (2006.01) |
| G01R 33/341 | (2006.01) |
| G01R 33/3873 | (2006.01) |
| G01R 33/3875 | (2006.01) |
| G01R 33/561 | (2006.01) |

(52) U.S. Cl.
CPC .... *G01R 33/4833* (2013.01); *G01R 33/34076* (2013.01); *G01R 33/3607* (2013.01); *G01R 33/341* (2013.01); *G01R 33/3873* (2013.01); *G01R 33/3875* (2013.01); *G01R 33/5612* (2013.01)

(58) Field of Classification Search
USPC .................................................. 324/309, 312
See application file for complete search history.

(56) References Cited

U.S. PATENT DOCUMENTS

| | | | |
|---|---|---|---|
| 8,994,372 B2 | 3/2015 | Bitz et al. | |
| 9,097,781 B2 | 8/2015 | Griswold | |
| 2015/0309132 A1 | 10/2015 | Brown et al. | |
| 2017/0052189 A1* | 2/2017 | Salinas Martin | ...... A61K 39/00 |

FOREIGN PATENT DOCUMENTS

WO   WO-2015/073894 A2   5/2015

\* cited by examiner

*Primary Examiner* — Vincent Q Nguyen
(74) *Attorney, Agent, or Firm* — Schiff Hardin LLP

(57) ABSTRACT

In a magnetic resonance (MR) apparatus and a method for operation thereof, the radio-frequency (RF) resonator of the scanner of the apparatus fed from a single RF source and is operated, during a total scan duration for acquiring MR scan data from a subject, so as to excite nuclear spins in the subject with respective RF fields having different B1+ field profiles that are radiated at respectively different times during the acquisition of the scan data. The scan data acquired during the scan thus are produced from MR signals caused by nuclear spins excited by at least two different B1+ field profiles. The scan can be used to acquire MR data for MR fingerprinting.

18 Claims, 9 Drawing Sheets

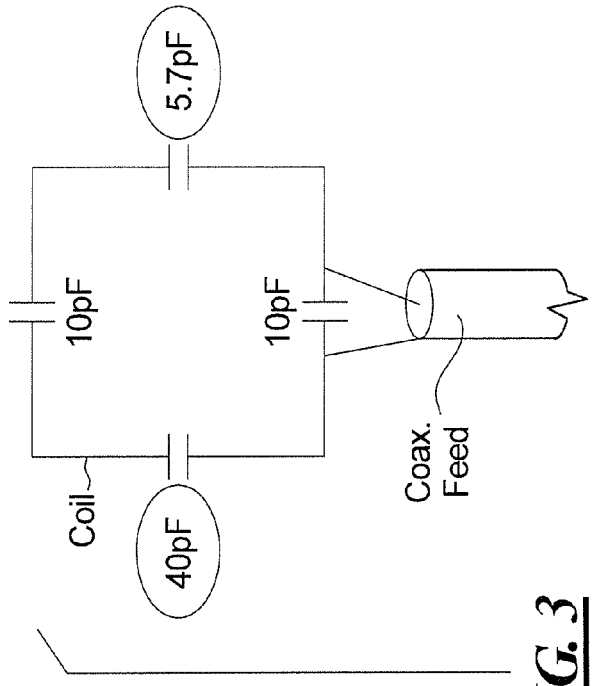
*FIG. 2*
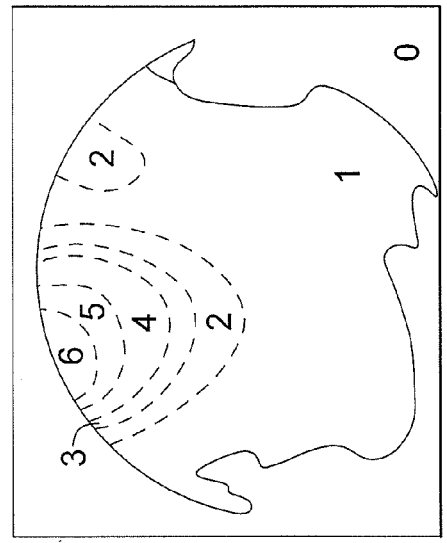
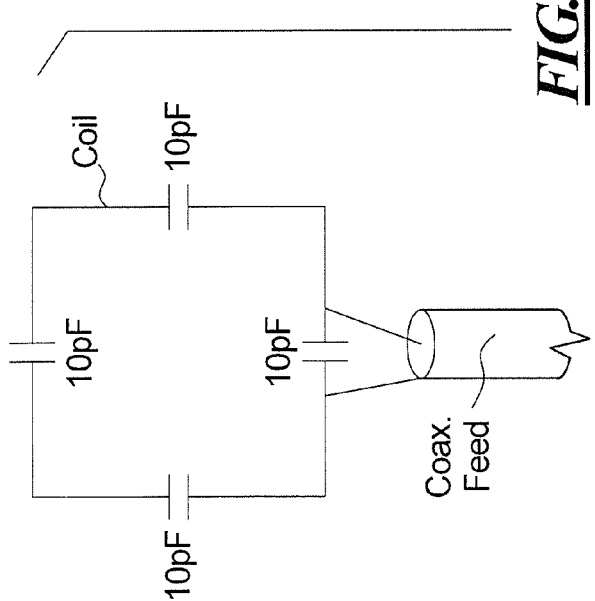
*FIG. 3*
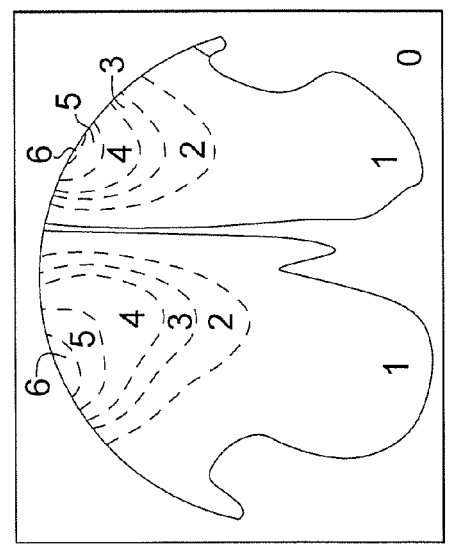

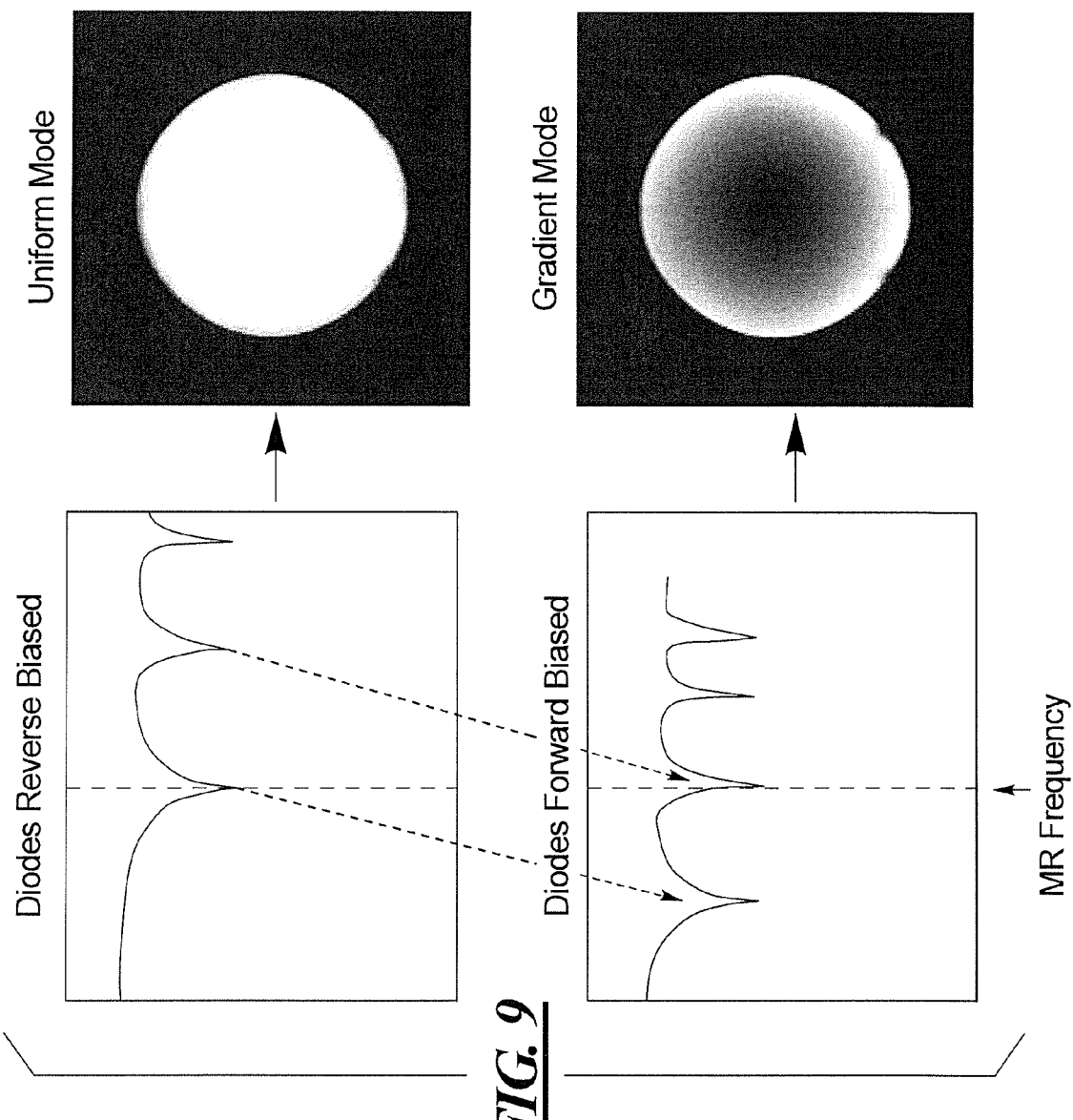
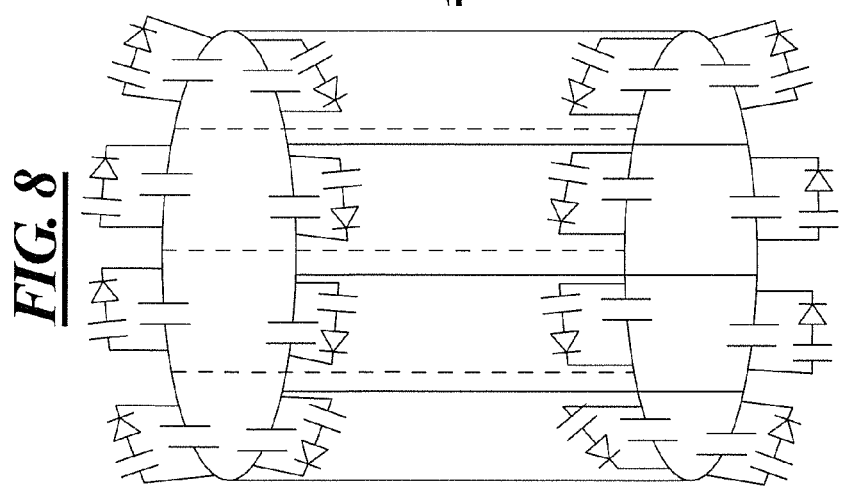
FIG. 8
FIG. 9

Gradient Mode

Uniform Mode

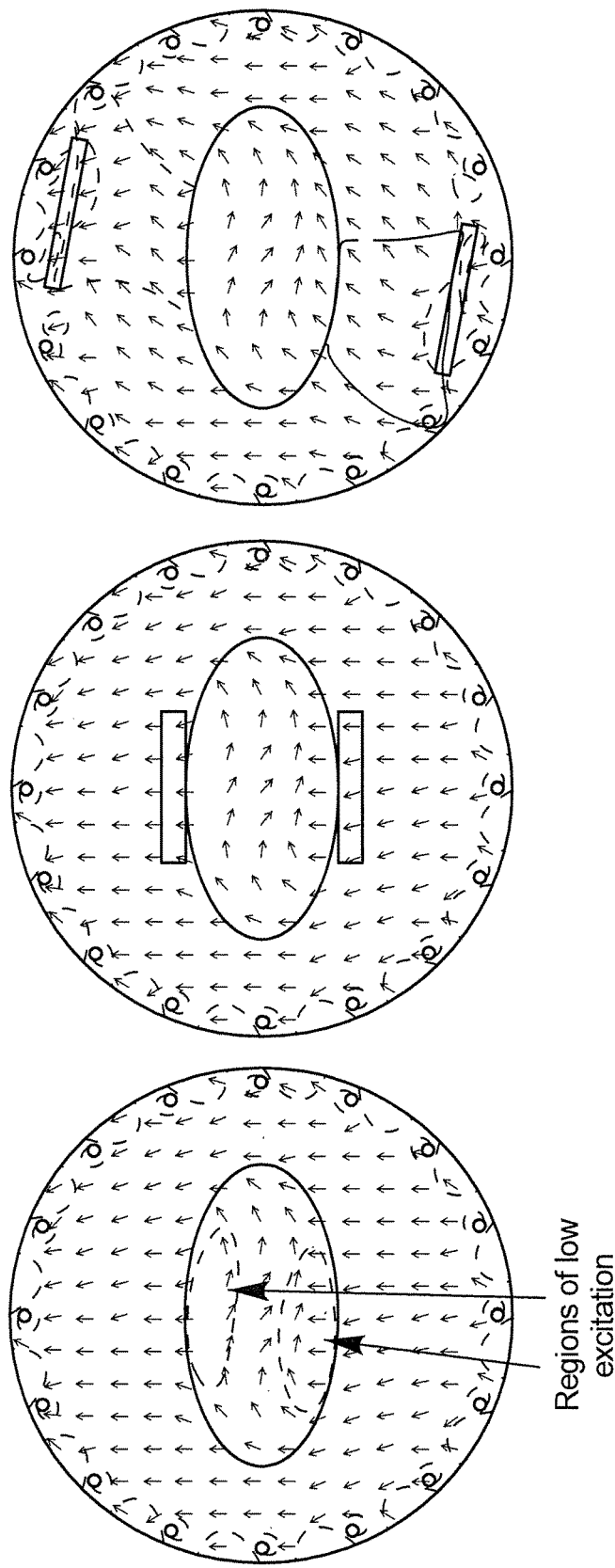

MAGNETIC RESONANCE APPARATUS AND METHOD FOR OPERATION THEREOF WITH ACTIVELY CONTROLLABLE RADIO-FREQUENCY COIL PROFILES

BACKGROUND OF THE INVENTION

Field of the Invention

The present invention concerns the field of magnetic resonance imaging, and in particular to the control and operation of radio-frequency (RF) coils of a magnetic resonance scanner.

Description of the Prior Art

Magnetic resonance imaging is a commonly used medical diagnostic modality that has superior capabilities for depicting internal organs and physiological processes within an examination subject.

In order to acquire magnetic resonance scan data (raw data) from an examination, the subject is situated in a magnetic resonance data acquisition scanner. The basic field produced by the scanner is a static magnetic field, which aligns nuclear spins of atoms within the examination subject along the lines of the basic magnetic field. RF energy is radiated into the examination subject by one or more RF antennas (RF coils) with the RF energy being radiated at an appropriate frequency that satisfies the conditions for exciting nuclear spins of specific atoms to magnetic resonance. The excited nuclear spins are thereby caused to deviate from the aforementioned alignment, by an amount known as a "flip angle." When the RF radiation ceases, the nuclear spins begin to relax, and thereby emit magnetic resonance signals, which are detected by suitable RF antennas or coils, and recorded as scan data or raw data. The antennas used to detect the magnetic resonance signals, which are also RF signals, may be the same as the antennas that used to radiate the RF energy. It is often the case that the RF energy is radiated by a whole-body antenna that is built into the magnetic resonance data acquisition scanner, and the resulting magnetic resonance signals are detected by smaller coils, called local coils, that can either be placed on the examination subject directly, or embodied in the patient bed on which the patient lies within the scanner. Such local coils cover only a smaller body region of the subject, such as a knee, a shoulder, or the head, and thus allow the magnetic resonance signals to be detected with a better signal-to-noise ratio than if the signals were detected by the larger whole body coil.

Local coils are typically single loop or multi-loop antennas, whereas the whole body coil is typically in the form of a so-called birdcage antenna in the shape of a hollow cylinder, with circular end conductors at each end of the cylinder, and longitudinal conductors proceeding along the length of the cylinder between the two end conductors. The magnetic resonance data acquisition scanner also includes a gradient coil arrangement, composed of multiple gradient coils that each generate a gradient magnetic field, respectively in the three directions of a Cartesian coordinate system. These gradient fields are used to spatially encode the magnetic resonance signals.

The magnetic resonance signals (raw data) acquired in this manner are entered into a memory at respective memory points as complex numbers. This collection of acquired raw data is called k-space, and is a datafile that can be processed in known ways in order to obtain an image of the region of the subject from which the raw data originated. The reconstructed image can be displayed on a monitor for viewing and evaluation thereof for medical diagnostic purposes.

In terminology commonly used in magnetic resonance imaging, the static magnetic field is called the B0 field, and oscillating magnetic field associated with the radiated RF energy is called the B1 field. The component of the B1 field which is circularly polarized in the correct sense to excite nuclear spins in the sample is known as the B1+ field. It is known that the shape and manner of operation of the RF antenna, or RF antennas that is/are used to radiate the RF energy can influence the shape and strength of the radiated B1+ field. The shape and strength distribution of the B1+ field is called the B1+ field profile.

The medical diagnostic question that is the reason for conducting the magnetic resonance examination often dictates the specific manner by which the magnetic resonance data acquisition scanner is operated in order to acquire the raw data, including the operation of the RF radiator, in order to produce a specific or customized B1+ field profile. Various techniques for setting one or more selected B1+ profiles prior to conducting a magnetic resonance examination are known. For example, in a technique known as RF shimming, a slice-specific, predetermined B1+ profile is set for each slice among multiple slices from which MR data are to be acquired.

It is also known in the case of parallel transmission techniques to control a number of transmit sources that can be combined dynamically during the data acquisition sequence. Examples are described in United States Patent Application Publication No. 2015/0309132. Another example is known as the TIAMO (Time Interleaved Acquisition of Modes) technique, wherein switching between two different RF modes takes place during a scan. The TIAMO method is described in detail in U.S. Pat. No. 8,994,372. As described therein, a uniform mode and a gradient mode excitation of nuclear spins are interleaved during the data acquisition. A drawback of the TIAMO technique is that the image contrast in the reconstructed image may be poorly defined. Moreover, the TIAMO method produces the aforementioned different modes by the control of multiple RF sources.

Another technique that is achieving substantial use in clinical practice is MR fingerprinting, wherein nuclear spins of multiple, different substances in an examination region are simultaneously and repeatedly excited, and the different signal evolutions of the respective magnetic resonance signals from those different substances are evaluated, thereby allowing those different substances to be identified. A basic description of MR fingerprinting can be found in U.S. Pat. No. 9,097,781.

An improved technique for MR fingerprinting is described in WO 2015/073894 A2, the content of which is incorporated herein by reference. The procedure described therein makes use of multiple radio-frequency transmitters, each in communication with a computer and each independently driving a coil element or coil modes, wherein each of the independently driven coil elements (or coil modes) produces a set of distinct B1+ distributions. This procedure makes use of a series of very short individual scans and a precalculated library of possible signal evolutions. By comparing the actual signal evolution over a series of scans to the library, various physical attributes of the material being imaged can be deduced. This is in contrast to the TIAMO technique, wherein no library is used and an image is obtained with an undesirable spatially varying contrast due to the different B1+ distributions incorporated into the scan.

The method described in WO 2015/073894 A2 produces multiple reliable quantitative parameter maps. Moreover, compared to U.S. Pat. No. 9,097,781, the distinct spatial variations in the sensitivity profile of each transmit coil are simultaneously quantified and help improve the reconstruction. The data acquisition time also is reduced.

SUMMARY OF THE INVENTION

An object of the present invention is to provide a magnetic resonance apparatus, and in particular an RF radiator in a scanner of a magnetic resonance apparatus, that is operable to use one or more RF transmit configurations so as to be able to produce a virtually unlimited number of B1+ transmit field profiles during the total acquisition time of magnetic resonance data.

This objective is achieved in accordance with the present invention by a magnetic resonance apparatus, having a scanner with a single RF source and an RF circuit, which includes an RF radiator, in electrical communication with the RF source, and a method for operating such a magnetic resonance apparatus. The magnetic resonance data acquisition scanner is operated to acquire magnetic resonance scan data from an examination subject situated in the magnetic resonance data acquisition scanner, during a total scan duration. During this total scan duration, the RF radiator is fed from the single RF source in order to radiate, at respectively different times, an RF field during each of those different times that excites nuclear spins in the examination subject, so as to cause the nuclear spins to emit magnetic resonance signals that are detected as magnetic resonance scan data. In accordance with the invention, during the total scan duration, the RF radiator is operated, during at least some of the aforementioned different times, to radiate respective RF fields with different RF (B1+) field profiles. In other words, during one of these different times, an RF field will be radiated that has an RF field profile that differs from the RF field profile that is radiated during another of these different times. In accordance with the invention, magnetic resonance signals are detected from the excited nuclear spins caused by each of the first and second RF fields, thereby compiling a datafile, in the memory into which the MR signals (scan data) are entered, that contains both magnetic resonance signals originating from nuclear spins excited by the first RF profile and magnetic resonance signals originating from nuclear spins excited by the second RF profile.

Preferably, the different RF profiles are radiated at respectively different times in the execution of a data acquisition sequence for MR fingerprinting.

Preferably the (at least two) different RF profiles are complementary with respect to each other, so that gaps in the B1+ field can be filled.

The RF field profile of an RF radiator is dependent on the geometry of the coil or antenna, characteristics of the electrical signal in the coil or antenna, the distribution of current in the coil or antenna, and on the dielectric properties of the environment in which the coil or antenna is radiating the RF energy.

The RF radiator can be formed by one antenna or coil that has a radiating circuit that is fed by the single RF source and that includes one or more individually controllable current-altering components, such as tunable capacitors, that can be selectively cut into and cut out of the radiating circuit, such as by diode control in order to alter the current that flows through the radiating circuit as a result of being fed by the single RF source. In this embodiment, therefore, a single RF transmit channel, that terminates in a single RF antenna or coil, is used, and this single antenna or coil is given different transmit properties, at respectively different times during the magnetic resonance data acquisition, by cutting in and cutting out the current-altering components at the respectively different times.

In another embodiment, the RF radiator is composed of multiple individual antennas or coils that are all fed by the single RF source, and that each are configured so as to each have a different RF field profile, and these multiple coils or antennas are individually activated at respectively different times during the acquisition of the magnetic resonance data. Each RF antenna or coil in each embodiment can be formed as a whole body coil, such as by a birdcage antenna, or as a loop antenna or array of loop antennas, as is common in the case of local coils.

It is known to construct an RF radiator as a conductor, or conductor pad, formed on a flexible substrate, such as a polymer sheet, so that the RF radiator can be selectively curved as may be desired. In another embodiment of the invention, the different RF profiles at respectively different times are produced by making the substrate out of, or including within the substrate, of a dielectric material that has a dielectric characteristic that is controllable, such as by the selective supply of current to the substrate. Changing the dielectric property of the substrate changes the dielectric constant within the immediate environment in which the RF radiator radiates, thereby giving the radiated RF field a different field profile dependent on the strength of the dielectric constant that is produced by controlling the dielectric material of the substrate.

In another embodiment dielectric pads which are voltage controlled so as to change the dielectric value thereof, are provided inside an RF antenna, such as a birdcage antenna.

BRIEF DESCRIPTION OF THE DRAWINGS

FIG. 2 shows a circuit diagram of a first embodiment of an RF radiator in accordance with the invention, and the RF field pattern produced thereby.

FIG. 3 shows a circuit diagram of a second embodiment of an RF radiator in accordance with the invention, and the RF field pattern produced thereby.

FIG. 8 shows an example of an RF radiator in accordance with the invention in the embodiment of a birdcage antenna with current-altering components connected therein.

FIG. 9 shows the operation of the RF radiator in the embodiment of FIG. 8 with the diodes reversed biased to produce the uniform mode, and with the diodes forward biased to produce the gradient mode.

FIG. 14 schematically illustrates known manners of changing the RF field created inside an oval object within a birdcage body coil by the use of dielectric pads (B1 field shimming).

DESCRIPTION OF THE PREFERRED EMBODIMENTS

Figure 1:
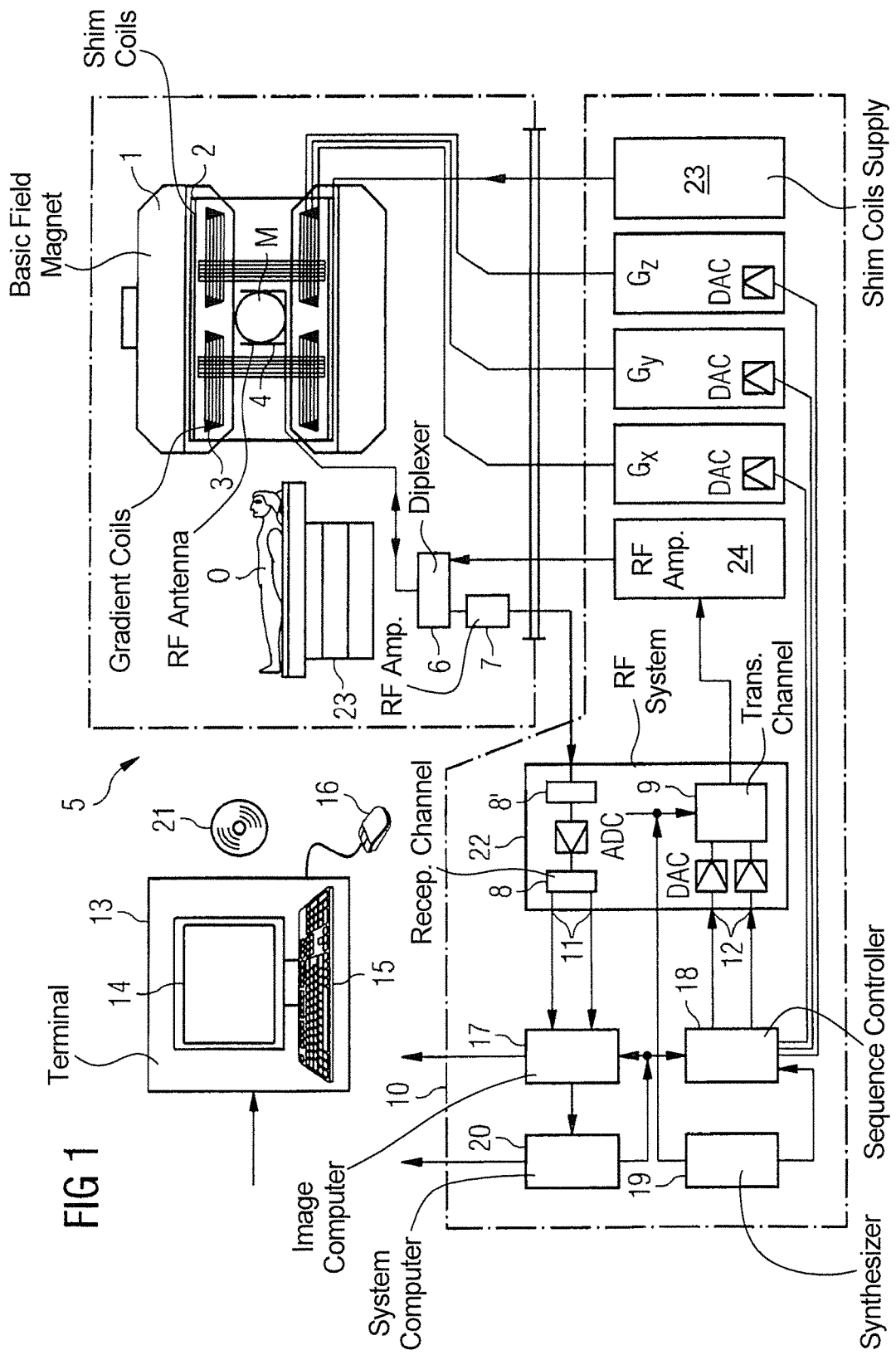
FIG. 1 schematically illustrates a magnetic resonance apparatus constructed and operating in accordance with the present invention.

FIG. 1 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 27 for the shim-coils 2.

A cylindrically shaped gradient coil system 3 is incorporated in the basic field magnet 1, composed of three windings. Each winding is supplied by a corresponding amplifier 24-26 with power for generating a linear gradient field in a respective axis of a Cartesian coordinate system. The first partial winding of the gradient field system 3 generates a gradient $G_x$ in the x-axis, the second partial winding generates a gradient $G_y$ in the y-axis, and the third partial winding generates a gradient $G_z$ in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28, serving as a single RF source for the one or more RF transmitting coils.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

FIGS. 2 and 3 are embodiments of the invention wherein a loop coil is fed with an RF signal from a coaxial cable (coax feed) from the RF amplifier 24. The RF resonator has an RF circuit in which current flows as a result of the RF feed. The RF circuit has current-altering components formed by capacitors. In the embodiment shown in FIG. 2, four series-connected 10 pF capacitors are used, which produce the B1+ field distribution shown at the bottom of FIG. 2. In this schematically illustrated B1+ field distribution, the region in which substantially no B1+ field is radiated is designated with reference numeral 0, and approximate regions of respectively different B1+ field strengths are designated by reference numerals 1 thru 6, with reference numeral 1 designating a region of lowest field strength and reference numeral 6 designating a region of highest field strength.

FIG. 3 illustrates how changing the capacitor distribution in the RF resonator changes the coil transmit profile. In the embodiment of the RF resonator shown in FIG. 3, two of the 10 pF capacitors from the embodiment of FIG. 2 have been changed, respectively, to a 40 pF capacitor and a 5.7 pF capacitor. The RF resonator shown in FIG. 3 produces the B1+ field profile shown at the bottom of FIG. 3.

Figure 4:
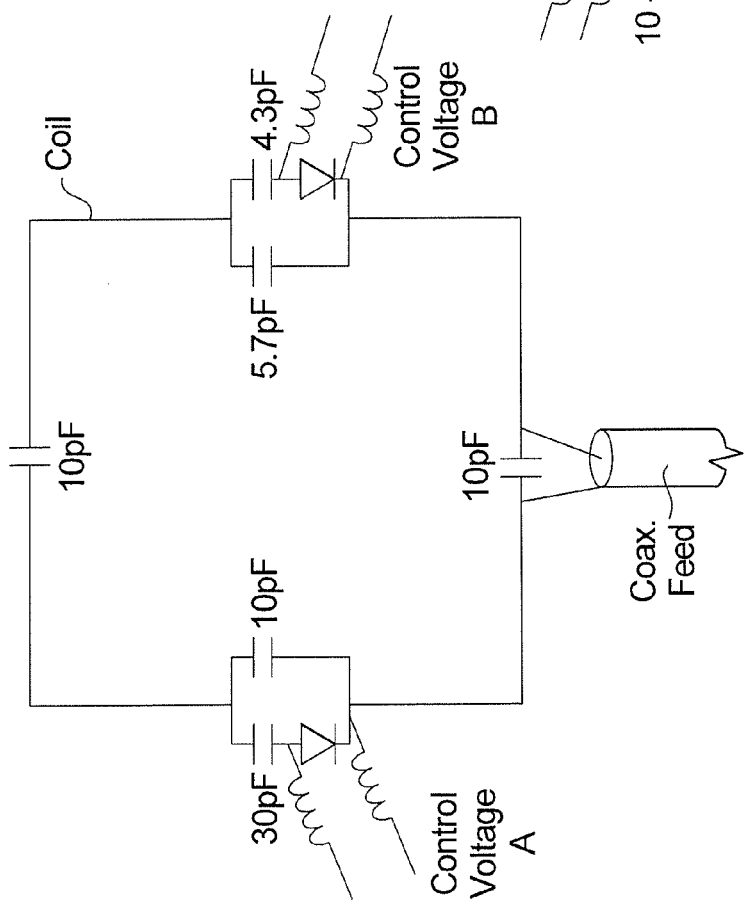
FIG. 4 is a circuit diagram of another embodiment of an RF radiator in accordance with the invention, with current-altering components formed by diode-controlled parallel circuits.

FIG. 4 illustrates a further manner of changing the capacitor distribution in order to change the coil transmit profile. In the embodiment shown in FIG. 4, in addition to two series-connected 10 pF capacitors, the RF resonator has two parallel sub-circuits. The sub-circuit at the left of the coil in FIG. 4 has a branch with a 10 pF capacitor, and a parallel branch with 30 pF capacitor connected in series with diode, which is connected to control voltage A. The parallel sub-circuit at the right of the coil in FIG. 4 has a branch containing a 5.7 pF capacitor, and a parallel branch containing a 4.3 pF capacitor and a diode connected in series therewith, operated with control voltage B.

When control voltage A reverse biases the diode in the left branch, thereby making that diode non-conducting, and control voltage B is forward biased, thereby making the diode connected thereto conducting, there will be 10 pF of capacitance on both sides of the coil. Reversing control voltage A and control voltage B produces a 40 pF capacitance on one side of the coil, and a 5.7 pF capacitance on the other side of the coil, thereby modifying the coil transmit profile.

Figure 5:
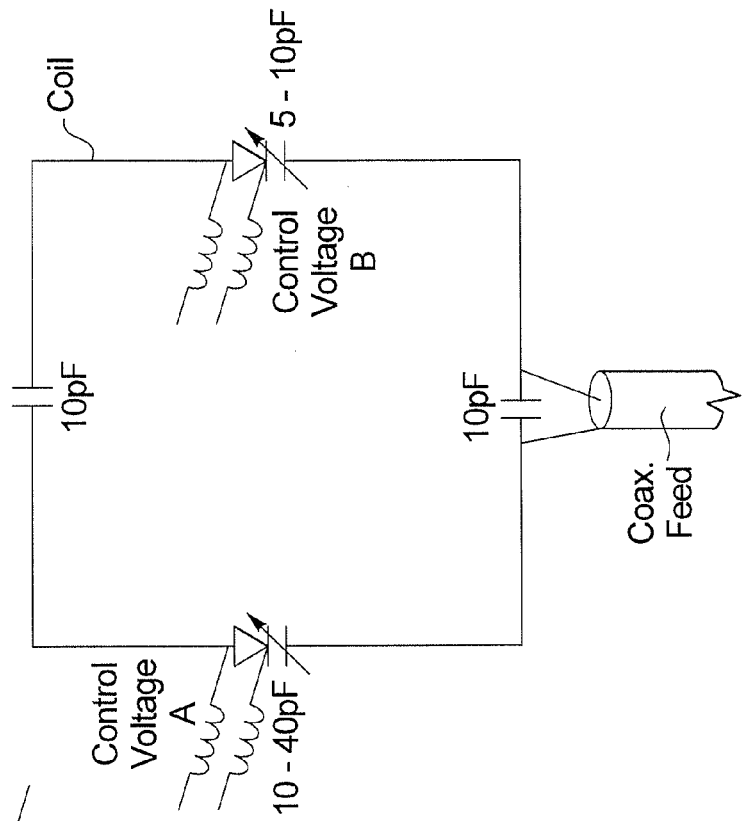
FIG. 5 is a circuit diagram of another embodiment of the RF radiator in accordance with the invention, with current-altering components formed by varactors.

FIG. 5 shows a further embodiment of an RF resonator in accordance with the invention wherein the current-altering components are varactors are respectively operated by control voltage A and control voltage B. By controlling control voltage A and control voltage B, the capacitance value of the respective varactors can be changed in the ranges respectively indicated in FIG. 5.

Figure 6:
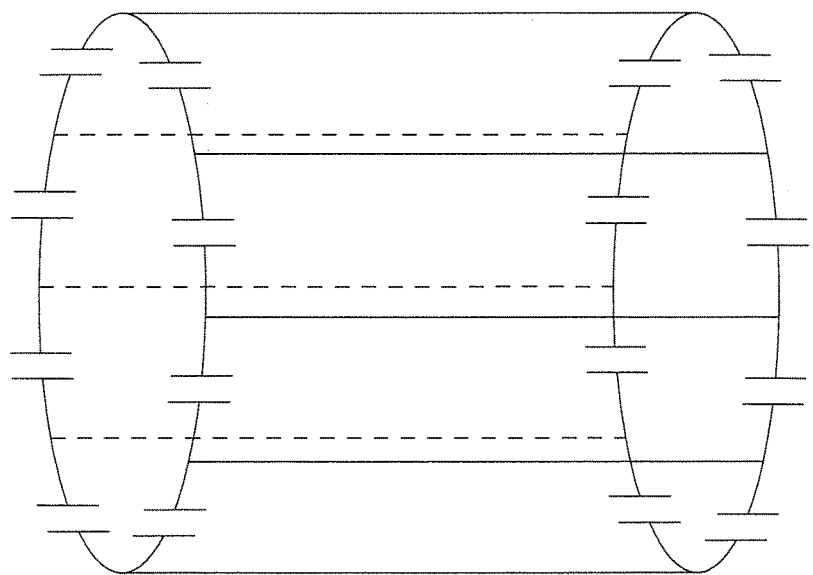
FIG. 6 shows a conventional birdcage antenna.

FIG. 6 illustrates a conventional birdcage antenna of the type described previously. This known antenna has a cylindrical shape, with two conductor rings at each end, connected by longitudinal conductors. Each end ring has a capacitance between the connecting nodes of adjacent longitudinal conductors. This type of birdcage antenna is typically used as a whole-body coil, and is usually built into the magnetic resonance data acquisition scanner.

Figure 7:
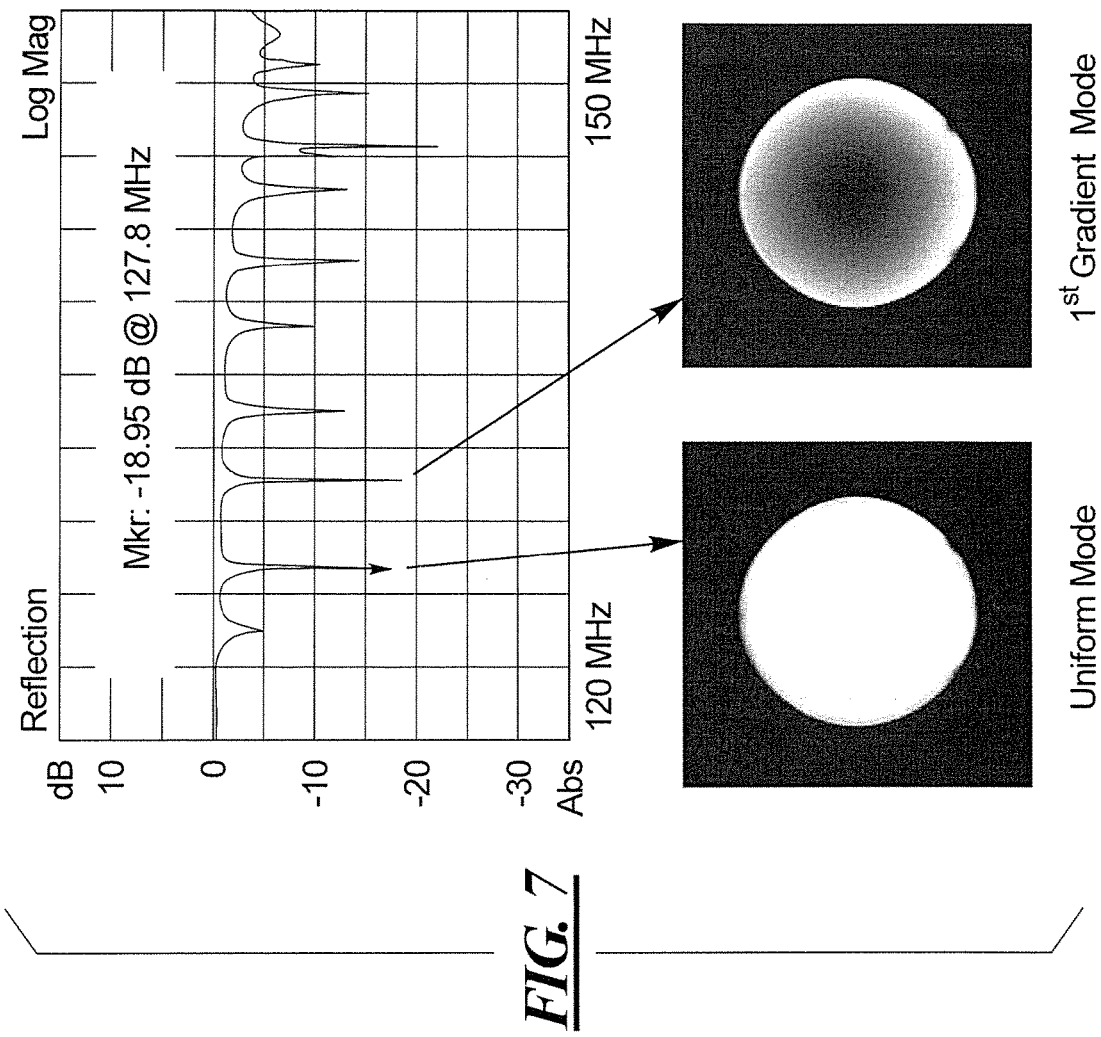
FIG. 7 shows the reflection parameter of the reflection parameter of an RF port connected to a birdcage antenna, as a function of frequency, with illustrations of different resonant modes.

Such a birdcage antenna can be operated in a number of resonant modes. Typically, the uniform mode is used, as shown in FIG. 7. FIG. 7 also shows the reflection parameters at an RF port connected to such a birdcage antenna, as a function of frequency. The resonant peak for the uniform mode can be seen, and changing the capacitor values can shift operation of the birdcage antenna to another mode at another resonant peak, indicated in FIG. 7 as the first gradient mode. The mode in which the birdcage antenna is operated is dependent on the desired frequency that is needed to excite nuclear spins of different atoms to resonance.

As also noted earlier, in a conventional birdcage antenna, the capacitance values cannot be changed during the course of a scan during which magnetic resonance raw data are acquired, but instead these values must be set (if they can be changed at all) prior to a scan.

FIG. 8 shows an embodiment of the invention wherein the RF resonator is formed as a birdcage antenna, wherein each capacitor in the standard birdcage antenna is connected in parallel with a capacitor/diode branch, that is operated as explained in connection with the embodiment of FIG. 4. FIG. 9 illustrates the different modes of the birdcage RF resonator in accordance with the invention that can be achieved with the diodes being reversed biased and forward biased, with the resonant MR frequencies indicated by the peaks.

Figure 10B:
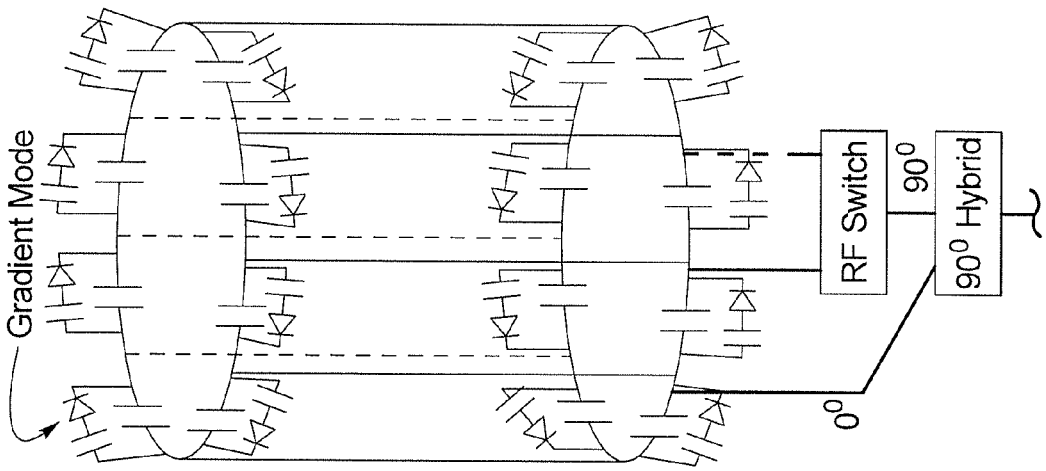
FIGS. 10A and 10B schematically illustrate the switching operation of the RF radiator in the embodiment of FIG. 8 in accordance with the invention, to produce the uniform mode and the gradient mode.
Figure 10A:
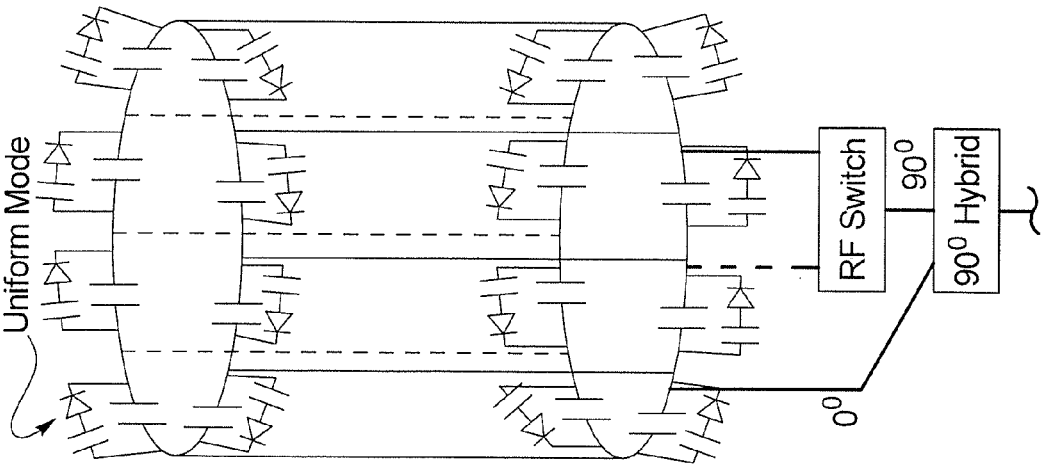

FIGS. 10A and 10B illustrate a further embodiment for operating the birdcage RF resonator in accordance with the invention wherein quadrature excitation is achieved by changing the drive point between the uniform mode and the gradient modes. This is accomplished by a 90° hybrid circuit, which has a 0° output and a 90° output. The 90° output is connected to an RF switch, which, dependent on its switching state, can supply the 90° output selectively to two different drive points of the birdcage RF resonator. The RF switch is switched by signals from the sequence controller 18.

Figure 11:
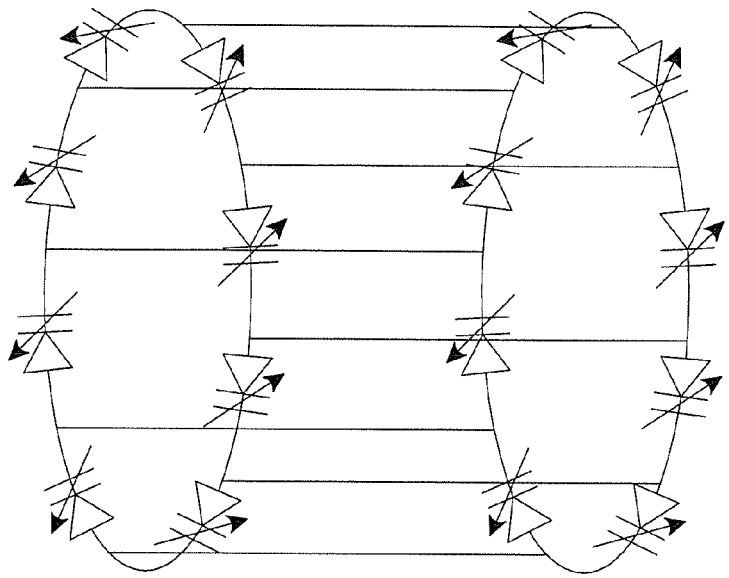
FIG. 11 shows a further embodiment of an RF radiator in accordance with the invention in the form of a birdcage antenna with current-altering components, formed by varactors, connected therein.

FIG. 11 shows an embodiment of the invention wherein the RF resonator is formed as a birdcage antenna with the capacitances being formed by controllable varactors, operated as explained in the embodiment of FIG. 5.

Figure 12A:
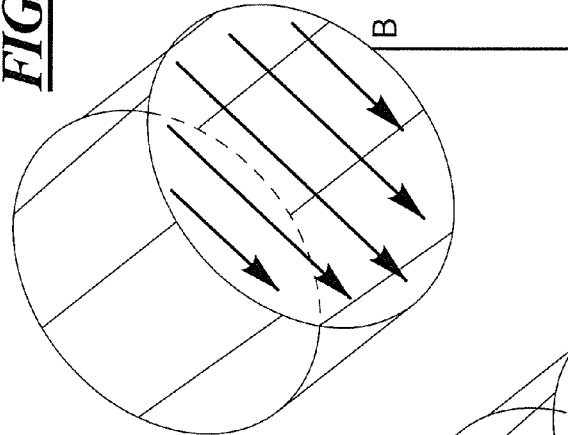
FIGS. 12A and 12B schematically illustrate the different linear modes of a birdcage antenna achieved by driving the birdcage antenna at respectively different ports.
Figure 12B:
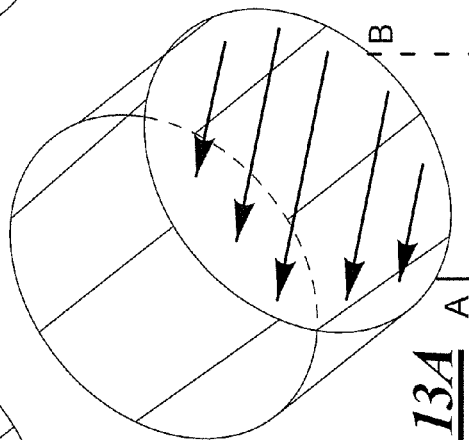
Figure 13A:
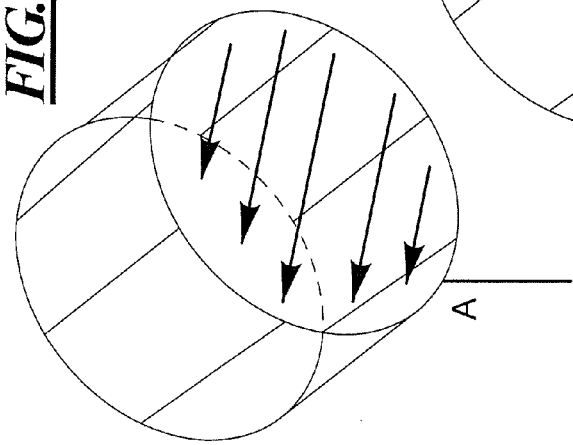
FIGS. 13A and 13B schematically illustrate operation of an RF antenna in accordance with the invention, formed as a birdcage antenna, with switching between different linear modes.
Figure 13B:
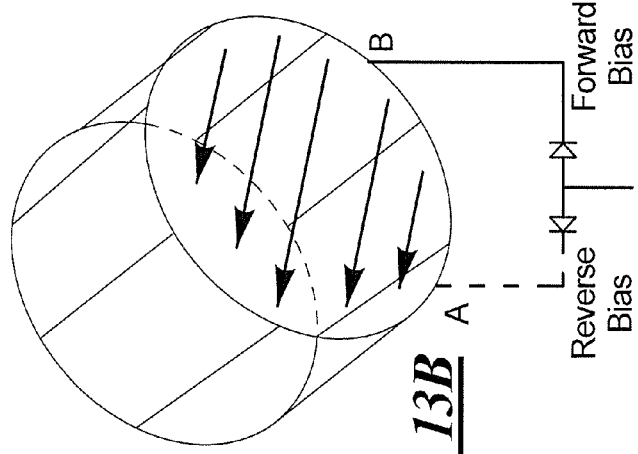

FIGS. 12A and 12B schematically illustrate the different linear modes of the birdcage antenna that can be achieved by physically changing the respective connection points A and B. FIGS. 13A and 13B show how this is accomplished with forward and reversed biased diode operation, thereby avoiding a need for two separate RF amplifiers.

FIG. 14 schematically illustrates the B1+ field that is produced inside an oval object, which is inside a cylindrical birdcage body coil. In each illustration shown in FIG. 14, the circles represent a sectional view of the longitudinal conductors, and the arrows indicate the direction of the RF field. In the left illustration in FIG. 14, regions of low excitation within the oval (which may represent an examination subject) are indicated by dashed lines. The center illustration and the right illustration in FIG. 14 show how the field direction, and thus the RF excitation, within the oval subject can be changed by placing dielectric pads on the subject (center illustration) or near the transmit coil (right illustration). Regions of lower excitation are also schematically illustrated by dashed lines in the right illustration. This technique is known as passive or dielectric B1+ shimming.

Figure 15:
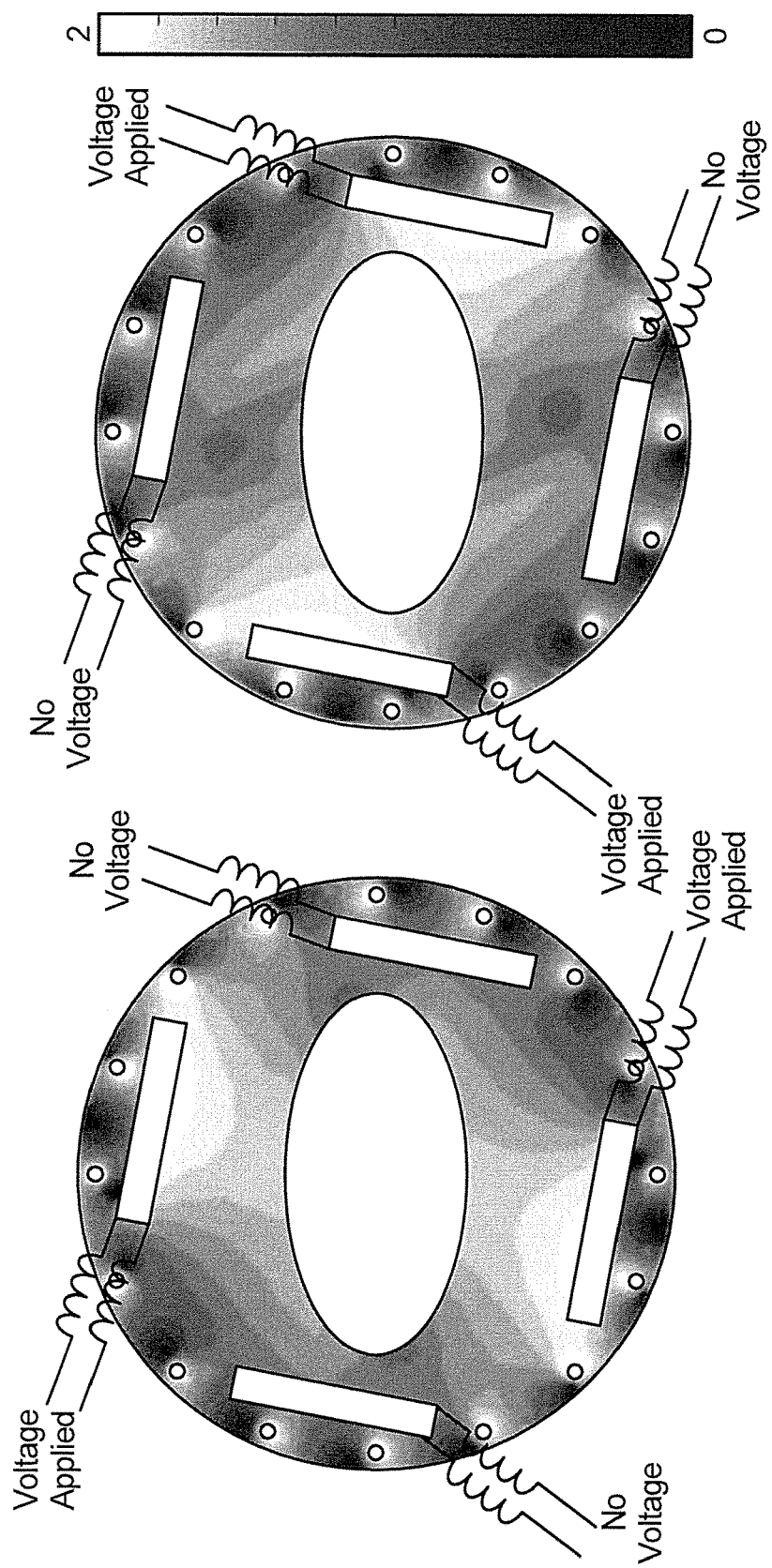
FIG. 15 schematically illustrates an embodiment of the invention wherein the RF radiators include voltage-controllable pads having a dielectric value that changes with applied voltage.

FIG. 15 schematically illustrates how pads formed by a material having a dielectric value that is changeable with applied voltage can be used to change the coil transmit profile dynamically during a data acquisition scan. FIG. 15 shows such pads being used inside a birdcage coil, but it is also possible to construct a local coil in accordance with the invention with the coil conductor being mounted, such as by forming the conductor as a conductor run, on a dielectric pad, that is composed entirely or partially of dielectric material. FIG. 15 shows how changing the applied voltage changes the excitation profile, as indicated by the different field arrows in FIG. 15. In the left illustration in FIG. 15, no voltage is applied to the pads at the left and right of the examination subject, and voltages applied to the pads above and below the subject, and the situation is reversed in the illustration shown at the right of FIG. 15. The voltages applied to the pads are from a voltage source (not shown) that is controlled by the sequence controller 18. The generated field strengths are shown according to the shading scale at the right of FIG. 15.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance (MR) apparatus comprising an MR data acquisition scanner comprising an RF radiator comprising a radiator circuit, said method comprising:
    operating said MR data acquisition scanner while an examination subject is situated in the MR data acquisition scanner during a total scan duration;
    during said total scan duration, feeding said RF radiator from a single RF source and thereby causing said RF radiator, at respectively different times, to radiate a selected RF field during each of said different times that excites nuclear spins in said examination subject so as to cause the excited nuclear spins to emit MR signals that are detected as said MR scan data;
    during said total scan duration, altering a current flowing in said radiator circuit, during at least some of said different times, to cause said RF radiator to respectively radiate said selected RF fields as respective B1+ fields with different B1+ field profiles during said at least some of said respective times, thereby exciting all of said nuclear spins with at least one of said B1+ field profiles and exciting at least some of said nuclear spins with multiple, different B1+ field profiles;
    operating said MR data acquisition scanner to detect said MR signals from said nuclear spins, each of said MR signals having a signal evolution;
    providing said MR signals to a processor having access to a memory containing a plurality of precalculated signal evolutions for respectively different substances, and comparing the signal evolution of said MR signals to said precalculated signal evolutions to obtain a comparison result that identifies a substance that produced said MR signals; and
    making an identification of said substance available in electronic form from said processor.

2. A method as claimed in claim 1 comprising operating said MR data acquisition scanner to detect said scan data in an MR fingerprinting data acquisition sequence.

3. A method as claimed in claim 1 comprising operating said RF radiator, during one of said different times, to radiate said RF field with a first B1+ field profile that is complementary to a second B1+ field profile radiated at another of said different times.

4. A method as claimed in claim 1 wherein said radiator circuit comprises at least one current-altering component connected therein that is operable to alter said current in said circuit, and wherein said method comprises operating said at least one current-altering component during said total scan duration to give said current-altering component a respectively different electrical values during said different times.

5. A method as claimed in claim 4 comprising employing a diode-controlled capacitor as said current-altering component.

6. A method as claimed in claim 4 comprising employing a varactor as said current- altering component.

7. A method as claimed in claim 1 comprising employing a loop coil as said RF resonator.

8. A method as claimed in claim 1 comprising employing a birdcage antenna as said RF resonator.

9. A method as claimed in claim 8 comprising operating said birdcage antenna with quadrature excitation of said nuclear spins, by switching an infeed point, at which said birdcage antenna is fed from said RF source, from a first infeed point to a second infeed point that differs from said first infeed point.

10. A magnetic resonance (MR) apparatus comprising:
    a single radio-frequency (RF) source;
    an MR data acquisition scanner comprising an RF radiator comprising a radiator circuit in electrical communication with said single RF source;
    a computer configured to operate said MR data acquisition scanner while an examination subject is situated in the MR data acquisition scanner during a total scan duration;
    said computer being configured to operate said RF radiator, at respectively different fillies during said total scan duration, to feed said RF radiator from said single RF source so as to radiate an RF field during each of said different times that excites nuclear spins in said examination subject so as to cause the excited nuclear spins to emit MR signals that are detected as said MR scan data;
    said computer being configured to operate said MR data acquisition scanner to alter a current flowing in said radiator circuit, during at least some of said different times, to cause said RF radiator to respectively radiate said RF fields as respective B1+ fields with different B1+ field profiles during said at least some of said respective times, thereby exciting all of said nuclear spins with at least one of said B1+ field profiles and exciting at least some of said nuclear spins with multiple, different B1+ field profiles;
    said computer being configured to operate said MR data acquisition scanner to detect said MR signals from said nuclear spins, each of said MR signals having a signal evolution;
    a memory comprising a plurality of precalculated signal evolutions respectively for different substances;
    a processor provided with said MR signals, said processor having access to said memory and being configured to compare the signal evolution of said MR signals to said precalculated signal evolutions to obtain a comparison result that identifies a substance that produced said MR signals; and
    said processor being configured to make an identification of said substance available in electronic form from said processor.

11. An MR apparatus as claimed in claim 10 wherein said computer is configured to operate said MR data acquisition scanner to detect said scan data in an MR fingerprinting data acquisition sequence.

12. An MR apparatus as claimed in claim 10 wherein said computer is configured to operate said RF radiator, during one of said different times, to radiate said RF field with B1+ field profile that is complementary to a B1+ field profile radiated at said another of different times.

13. An MR apparatus as claimed in claim 10 wherein said radiator circuit comprises at least one current-altering component connected therein that is operable to alter said current in said circuit, and wherein said computer is configured to operate said at least one current-altering component during said total scan duration to give said current-altering component respectively different electrical values during said different times.

14. An MR apparatus as claimed in claim 13 wherein said current-altering component is a diode-controlled capacitor.

15. An MR apparatus as claimed in claim 13 wherein said current-altering component is a varactor.

16. An MR apparatus as claimed in claim 10 wherein said RF resonator is a loop coil.

17. An MR apparatus as claimed in claim 16 wherein said computer is configured to operate said birdcage antenna with quadrature excitation of said nuclear spins, by switching an infeed point, at which said birdcage antenna is fed from said RF source, from a first infeed point to a second infeed point that differs from said first infeed point.

18. An MR apparatus as claimed in claim 10 wherein said RF resonator is a birdcage antenna.

* * * * *